(12) United States Patent
Arao

(10) Patent No.: US 9,839,151 B2
(45) Date of Patent: Dec. 5, 2017

(54) ELECTRONIC DEVICE HAVING A WATERPROOF STRUCTURE

(71) Applicant: KYOCERA Corporation, Kyoto (JP)

(72) Inventor: Katsumi Arao, Higashiosaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/199,449

(22) Filed: Jun. 30, 2016

(65) Prior Publication Data

US 2016/0381820 A1 Dec. 29, 2016

Related U.S. Application Data

(63) Continuation of application No. 14/651,981, filed as application No. PCT/JP2013/083212 on Dec. 11, 2013, now Pat. No. 9,386,716.

(30) Foreign Application Priority Data

Dec. 13, 2012 (JP) ................................ 2012-271862

(51) Int. Cl.
*H01H 13/06* (2006.01)
*H05K 5/00* (2006.01)
(Continued)

(52) U.S. Cl.
CPC ................. *H05K 5/03* (2013.01); *G06F 1/16* (2013.01); *G06F 1/1656* (2013.01); *H01H 9/04* (2013.01);
(Continued)

(58) Field of Classification Search
None
See application file for complete search history.

(56) References Cited

U.S. PATENT DOCUMENTS 5,746,307 A 5/1998 Joss
5,749,457 A * 5/1998 Castaneda ............ H01H 1/5805
200/343
(Continued)

FOREIGN PATENT DOCUMENTS

JP 2001-222927 A 8/2001
JP 2006-344528 A 12/2006
(Continued)

OTHER PUBLICATIONS

International Search Report and Written Opinion of the International Searching Authority issued by Japan Patent Office for International Application No. PCT/JP2013/083212.
(Continued)

*Primary Examiner* — Xanthia C Cunningham
(74) *Attorney, Agent, or Firm* — Procopio Cory Hargreaves and Savitch LLP

(57) ABSTRACT

An electronic device according to the present invention comprises a main body including a pair of body chassis, a pair of cover panels disposed to cover the front face and the back face of the main body, a switch unit disposed on the side part of the main body, an operation button which is held between the pair of cover panels and has a pusher projecting therefrom, a housing recess which is formed on at least one of the body chassis and recessed on a joint surface with the other body chassis to form a housing chamber for the switch unit, a through hole penetrating the one body chassis from the side face toward the housing recess, and a bag-like waterproof packing member which is attached to the through hole and recessed toward the switch unit to house the pusher of the operation button. The pusher of the operation button passes through the through hole toward the switch unit, and the end of the waterproof packing member is pressed against
(Continued)

the switch unit to fixedly hold the switch unit inside the housing recess.

7 Claims, 18 Drawing Sheets

(51) Int. Cl.
| | |
|---|---|
| H05K 5/03 | (2006.01) |
| H05K 5/06 | (2006.01) |
| H01H 13/10 | (2006.01) |
| H04M 1/18 | (2006.01) |
| H04M 1/23 | (2006.01) |
| H01H 9/04 | (2006.01) |
| H01H 13/14 | (2006.01) |
| G06F 1/16 | (2006.01) |
| H05K 5/02 | (2006.01) |
| H04B 15/04 | (2006.01) |
| H04B 1/38 | (2015.01) |

(52) U.S. Cl.
CPC ............ *H01H 13/06* (2013.01); *H01H 13/10* (2013.01); *H01H 13/14* (2013.01); *H04M 1/18* (2013.01); *H04M 1/236* (2013.01); *H05K 5/0004* (2013.01); *H05K 5/0017* (2013.01); *H05K 5/0247* (2013.01); *H05K 5/069* (2013.01); *H01H 2013/066* (2013.01); *H01H 2221/026* (2013.01); *H01H 2221/08* (2013.01); *H01H 2223/002* (2013.01); *H01H 2231/022* (2013.01); *H04B 15/04* (2013.01); *H04B 2001/3894* (2013.01)

(56) References Cited

U.S. PATENT DOCUMENTS

| | | | |
|---|---|---|---|
| 6,100,484 A | 8/2000 | Houze | |
| 6,148,183 A * | 11/2000 | Higdon | H01H 13/807 200/343 |
| 6,546,231 B1 * | 4/2003 | Someya | H04M 1/274525 200/4 |
| 6,963,039 B1 * | 11/2005 | Weng | H01H 23/06 200/302.1 |
| 7,705,255 B2 * | 4/2010 | Yokote | H01H 13/06 200/302.2 |
| 7,772,507 B2 * | 8/2010 | Orr | G06F 1/1626 200/5 R |
| 8,098,494 B2 * | 1/2012 | Li | H04M 1/0277 200/296 |
| 8,238,595 B2 * | 8/2012 | Horowitz | H04R 1/345 381/345 |
| 8,259,930 B2 | 9/2012 | Kawasaki | |
| 8,598,474 B2 | 12/2013 | Chen | |
| 8,737,052 B2 * | 5/2014 | Cho | H04B 1/3883 200/5 A |
| 8,787,029 B2 * | 7/2014 | Yang | H01H 9/16 200/341 |
| 8,812,140 B2 * | 8/2014 | Huang | H04M 1/7253 455/149 |
| 8,946,575 B2 * | 2/2015 | Kikuchi | H01H 13/063 200/302.2 |
| 9,025,317 B2 * | 5/2015 | Richardson | H04M 1/0252 361/679.01 |
| 9,386,716 B2 | 7/2016 | Arao | |
| 2006/0171107 A1 * | 8/2006 | Yamamoto | G02F 1/133308 361/679.21 |
| 2007/0034493 A1 | 2/2007 | Kawasaki et al. | |
| 2007/0049357 A1 * | 3/2007 | Daimon | H04M 1/03 455/575.1 |
| 2009/0080153 A1 * | 3/2009 | Richardson | H04M 1/18 361/679.56 |
| 2009/0236207 A1 * | 9/2009 | Shi | H01H 13/06 200/302.2 |
| 2010/0044198 A1 * | 2/2010 | Tang | H01H 13/06 200/302.2 |
| 2010/0219057 A1 * | 9/2010 | Okuzumi | H01H 23/143 200/5 A |
| 2011/0042192 A1 * | 2/2011 | Hou | H01H 13/063 200/302.2 |
| 2012/0000760 A1 * | 1/2012 | Lutgring | H01H 9/22 200/520 |
| 2012/0067711 A1 * | 3/2012 | Yang | H01H 13/86 200/341 |
| 2012/0069501 A1 * | 3/2012 | Lai | H01H 13/86 361/679.01 |
| 2013/0001055 A1 * | 1/2013 | Ohata | H04M 1/18 200/293 |
| 2013/0062173 A1 | 3/2013 | Kang | |
| 2013/0098740 A1 * | 4/2013 | Cotha | H01H 13/06 200/302.2 |
| 2013/0134024 A1 * | 5/2013 | Cheng | H01H 13/86 200/5 A |
| 2013/0176665 A1 | 7/2013 | Oi | |
| 2013/0235539 A1 | 9/2013 | Hashimoto | |
| 2013/0242481 A1 | 9/2013 | Kim | |
| 2013/0277187 A1 * | 10/2013 | Huang | H01H 13/063 200/302.2 |
| 2013/0292235 A1 * | 11/2013 | Baum | H01H 13/06 200/302.2 |
| 2013/0313087 A1 * | 11/2013 | Le | H01H 13/06 200/302.2 |
| 2014/0069782 A1 * | 3/2014 | Shedletsky | H01H 13/50 200/17 R |
| 2014/0078655 A1 | 3/2014 | Hirose | |
| 2014/0252881 A1 | 9/2014 | Dinh | |
| 2016/0381820 A1 | 12/2016 | Arao | |

FOREIGN PATENT DOCUMENTS

| | | |
|---|---|---|
| JP | 2009-054430 A | 12/2009 |
| JP | 2012-199867 A | 10/2012 |
| JP | 2013-062243 A | 4/2013 |
| JP | 2014-120203 A | 6/2014 |

OTHER PUBLICATIONS

Office Action dated Aug. 1, 2017 issued in counterpart Japanese Application No. 2016-138307.

* cited by examiner

ENLARGED PART A

ENLARGED PART B

ENLARGED PART C

ENLARGED PART D

ENLARGED PART E

ELECTRONIC DEVICE HAVING A WATERPROOF STRUCTURE

CROSS REFERENCE TO RELATED APPLICATIONS

The present application is a continuation of U.S. application Ser. No. 14/651,981, filed on 12 Jun. 2015, which claims the benefit of PCT Application No. PCT/JP2013/083212 filed on 11 Dec. 2013, which claims the benefit of Japanese Application No. 2012-271862, filed on 13 Dec. 2012. The contents of the above applications are incorporated by reference herein in their entirety.

TECHNICAL FIELD

The present invention relates to an electronic device which has a waterproof structure and includes an operation button disposed on the side part of a main body.

BACKGROUND ART

In this type of electronic device, a pair of cover panels is disposed to cover the front face and the back face of a main body having a waterproof structure. The main body comprises a pair of body chassis joined together. A switch unit on which a tact switch is mounted is disposed on the side part of the main body. An operation button for pressing the tact switch of the switch unit is held between the pair of cover panels.

In such an electronic device, a through hole for allowing a pusher of the operation button to pass therethrough is formed on the side part of the main body. To avoid water to enter the inside of the main body through the through hole, a waterproof structure is required.

In an assembling process of an electronic device in which an operation button is disposed on the side part of a main body, the main body is assembled in the following manner. A switch unit is first housed inside a housing recess formed on one body chassis. The switch unit is then fixed inside the housing recess with an adhesive tape. Thereafter, the other body chassis is joined to the above body chassis. In this state, a pair of cover panels is attached to cover the front face and the back face of the main body.

Since the switch unit is required to be fixed inside the housing recess with an adhesive tape, not only the number of components is increased, but also the number of assembling steps may be increased.

Therefore, a reduction in the number of components or the number of assembling steps has been required in an electronic device which has a waterproof structure and includes an operation button disposed on the side part of a main body.

SUMMARY OF THE INVENTION

An electronic device having a waterproof structure according to the present invention comprises a main body having a waterproof structure, the main body including a built-in electronic component and a pair of body chassis joined together, a pair of cover panels disposed to cover a front face and a back face of the main body, a switch unit disposed on a side part of the main body, the switch unit including a contact, an operation button held between the pair of cover panels, the operation button having a pusher for pressing the contact of the switch unit, the pusher projecting from the operation button, a housing recess formed on at least one of the body chassis, the housing recess being recessed on a joint surface with the other body chassis to form a housing chamber for the switch unit, a through hole penetrating the one body chassis from a side face toward the housing recess, and a bag-like waterproof packing member attached to the through hole, the waterproof packing member being recessed toward the switch unit to house the pusher of the operation button. The pusher of the operation button passes through the through hole toward the contact of the switch unit, and an end of the waterproof packing member is pressed against the switch unit to fixedly hold the switch unit inside the housing recess.

DETAILED DESCRIPTION OF EMBODIMENT

Hereinbelow, an embodiment in which the present invention is embodied as an information terminal device will be specifically described with reference to the drawings.

Figure 1:
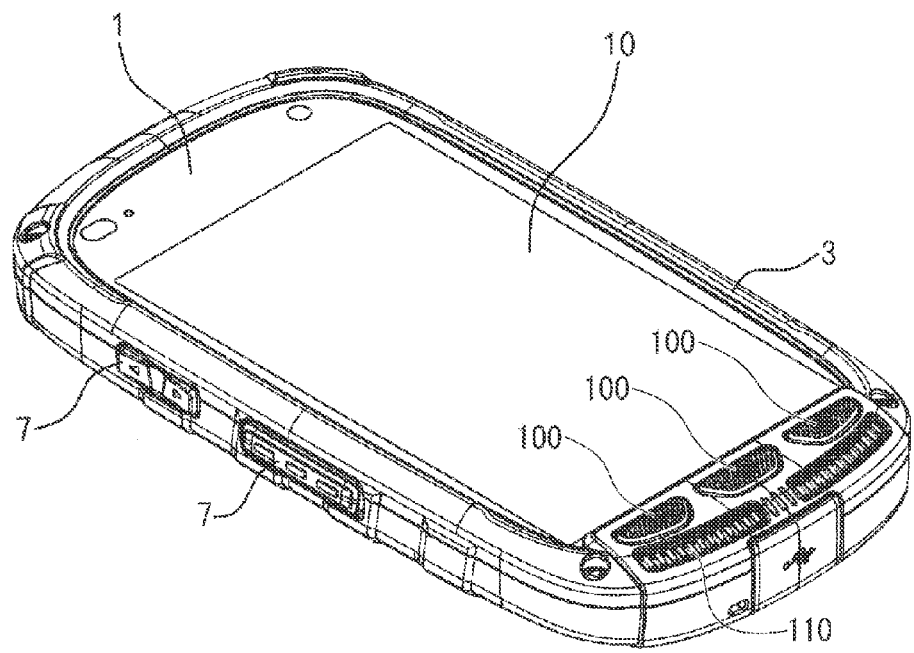
FIG. 1 is a perspective view illustrating the front face of an information terminal device which is an embodiment of the present invention.
Figure 2:
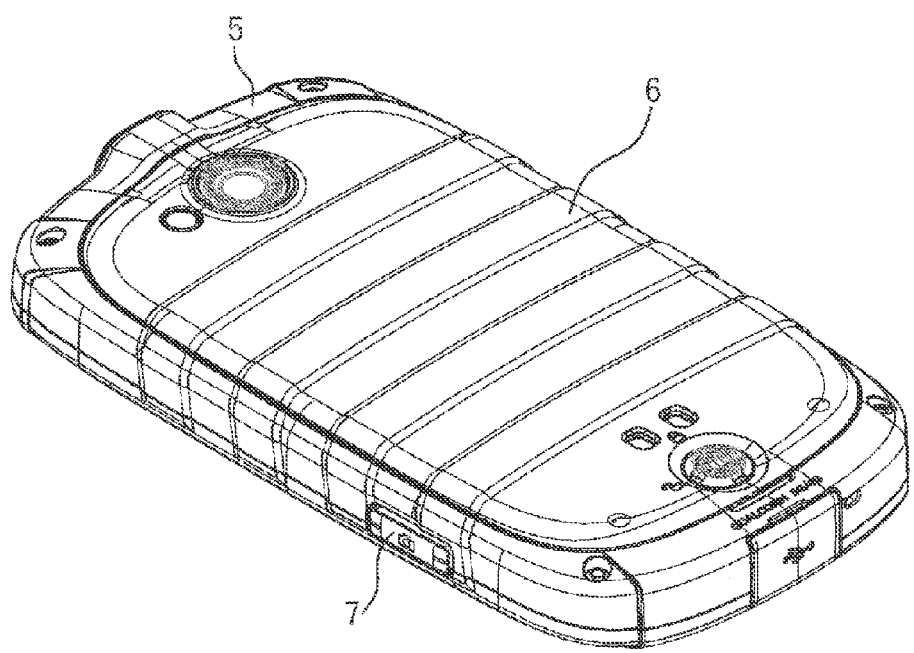
FIG. 2 is a perspective view illustrating the back face of the information terminal device.

As illustrated in FIGS. 1 and 2, an information terminal device as an embodiment of the present invention comprises a flat rectangular parallelepiped main body 1 which includes a display 10 and an electronic circuit both built therein. The front face of the main body 1 is covered with a front cover panel 3 made of a synthetic resin. The back face of the main body 1 is covered with a back cover panel 5 made of a synthetic resin. A screen of the display 10 is exposed from the front face of the main body 1. A plurality of operation buttons 7 are disposed on the side face of the main body 1. A cover body 6 is attached to the back face of the main body 1.

As illustrated in FIGS. 3 to 6, the main body 1 is formed by joining a front body chassis 2 and a back body chassis 4 together. An O-ring 11 is interposed between the front body chassis 2 and the back body chassis 4 to achieve waterproofing for the main body 1.

The front cover panel 3 is attached to the front body chassis 2 by a hook mechanism. The back body chassis 4 is attached to the back cover panel 5 by a hook mechanism.

A peripheral wall 40 which surrounds a battery housing chamber is formed on the back body chassis 4. The battery housing chamber is liquid-tightly closed by the cover body 6.

Figure 3:
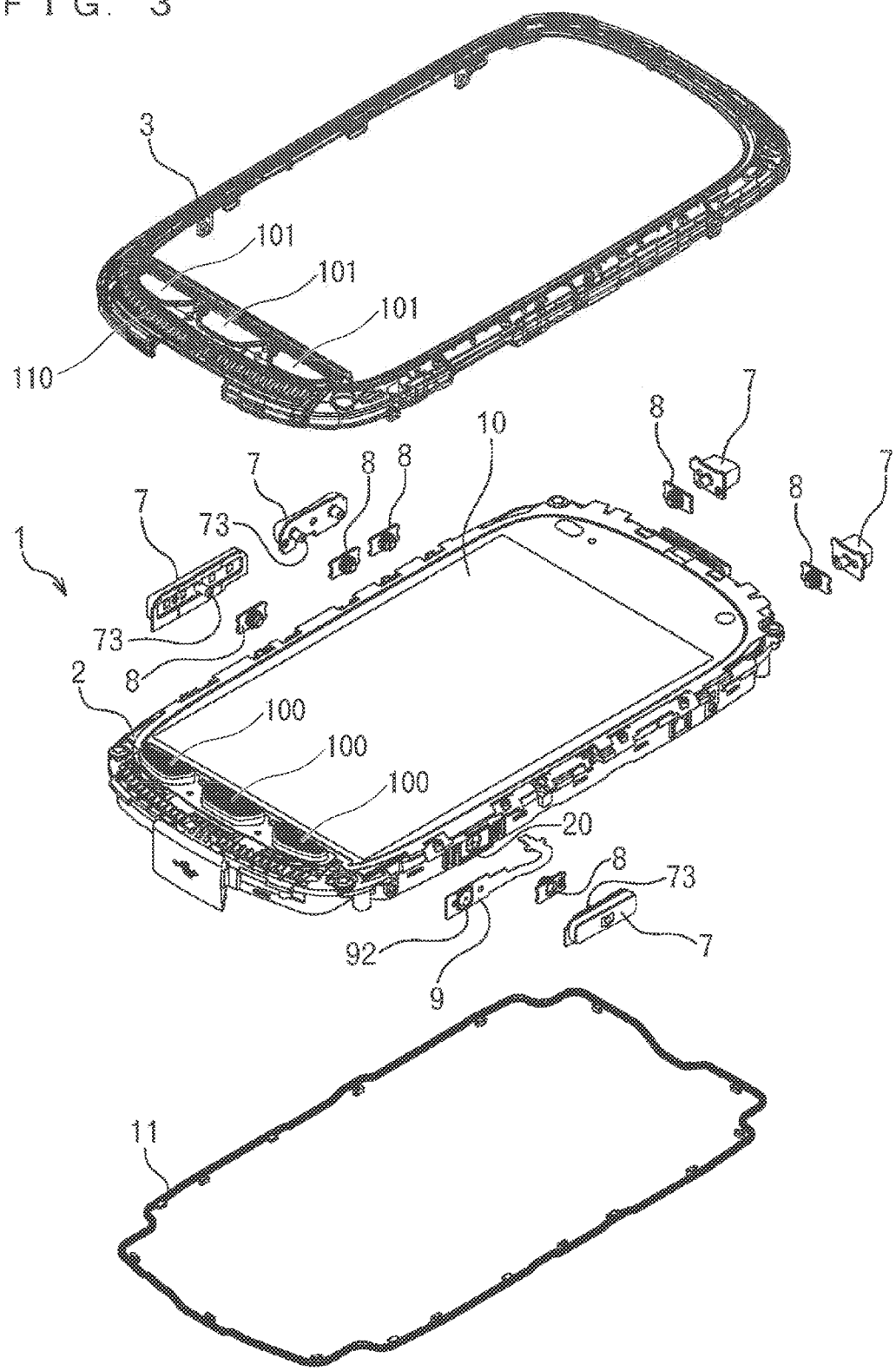
FIG. 3 is an exploded perspective view illustrating the configuration of the front side of the information terminal device.
Figure 4:
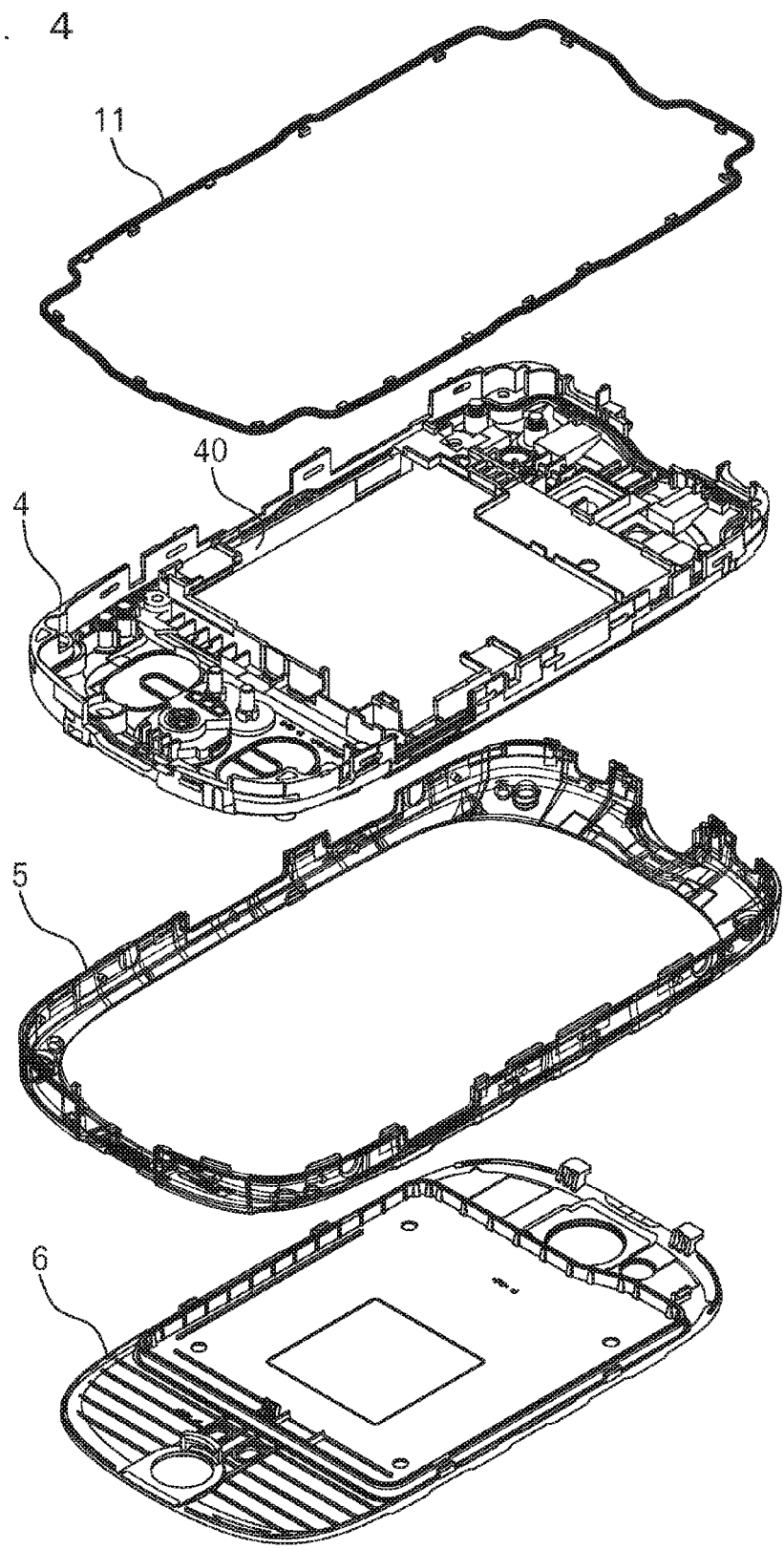
FIG. 4 is an exploded perspective view illustrating the configuration of the back side of the information terminal device.
Figure 5:
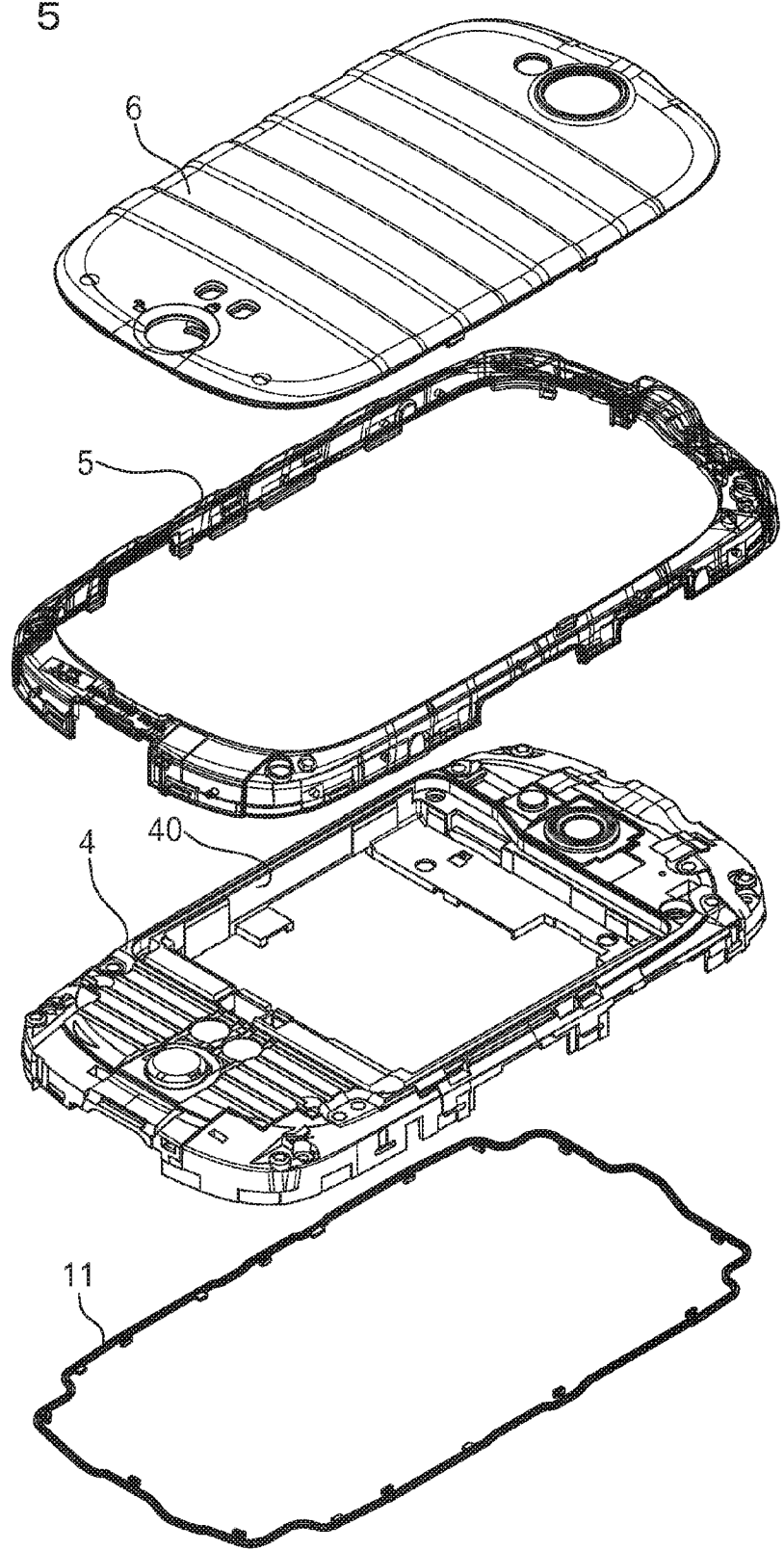
FIG. 5 is an exploded perspective view illustrating the configuration of the back side of the information terminal device upside down.
Figure 6:
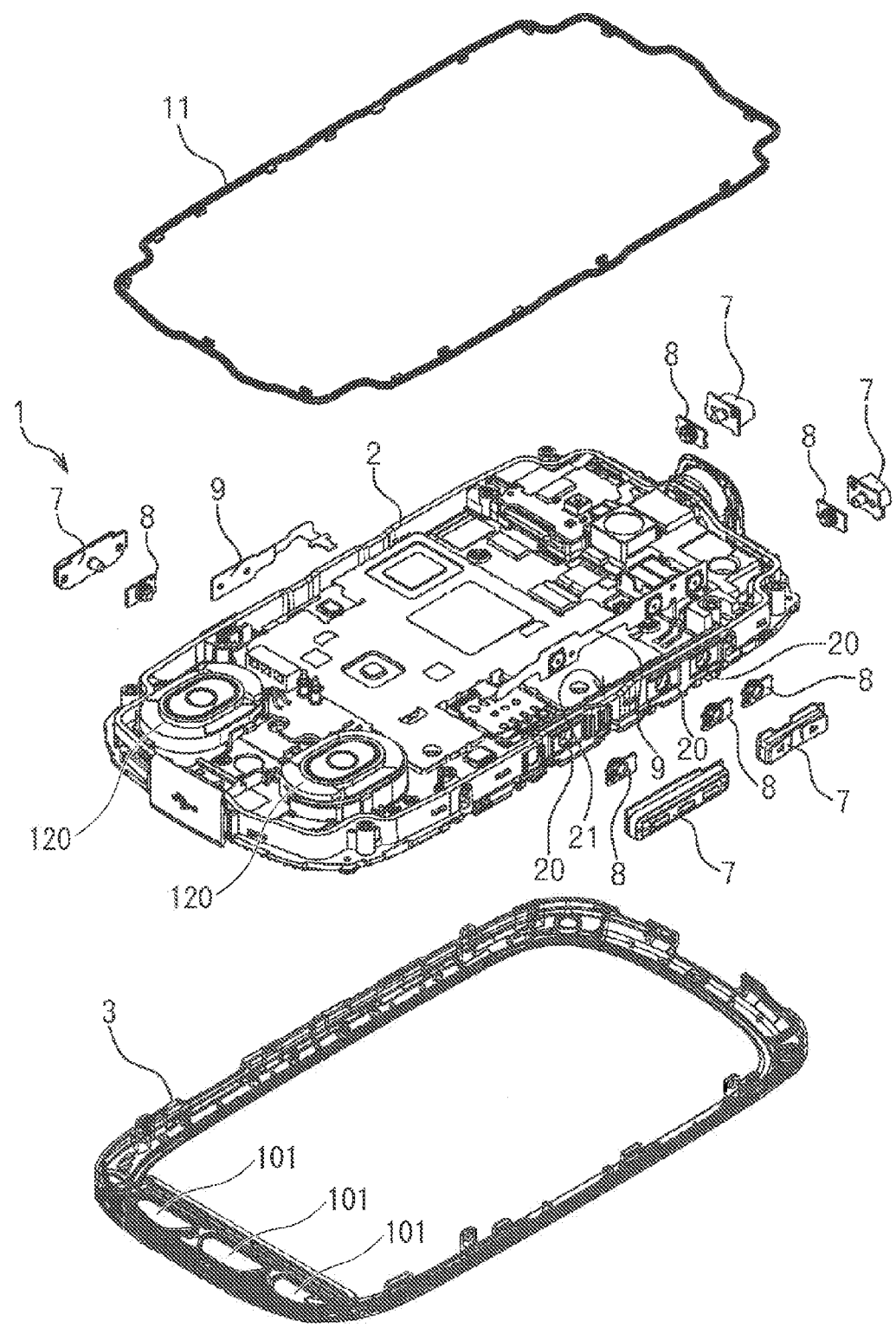
FIG. 6 is an exploded perspective view illustrating the configuration of the front side of the information terminal device upside down.
Figure 11:
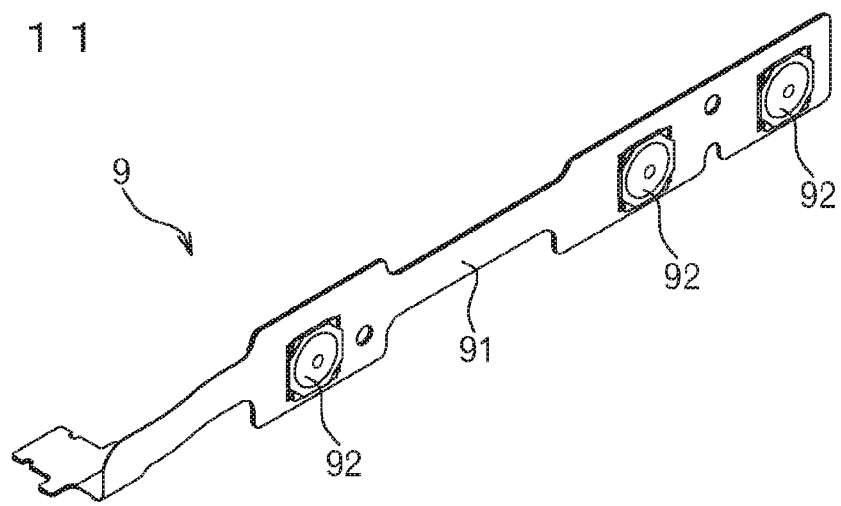
FIG. 11 is a perspective view of a switch unit.
Figure 12:
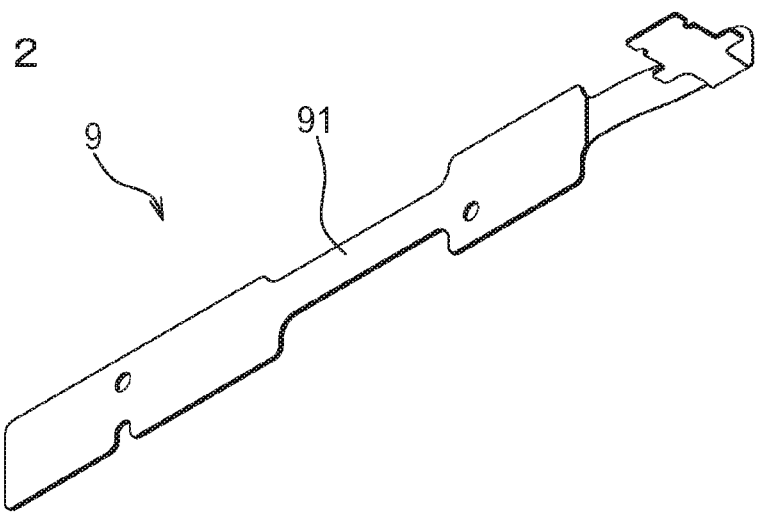
FIG. 12 is a perspective view of the switch unit viewed from a different direction.
Figure 13:
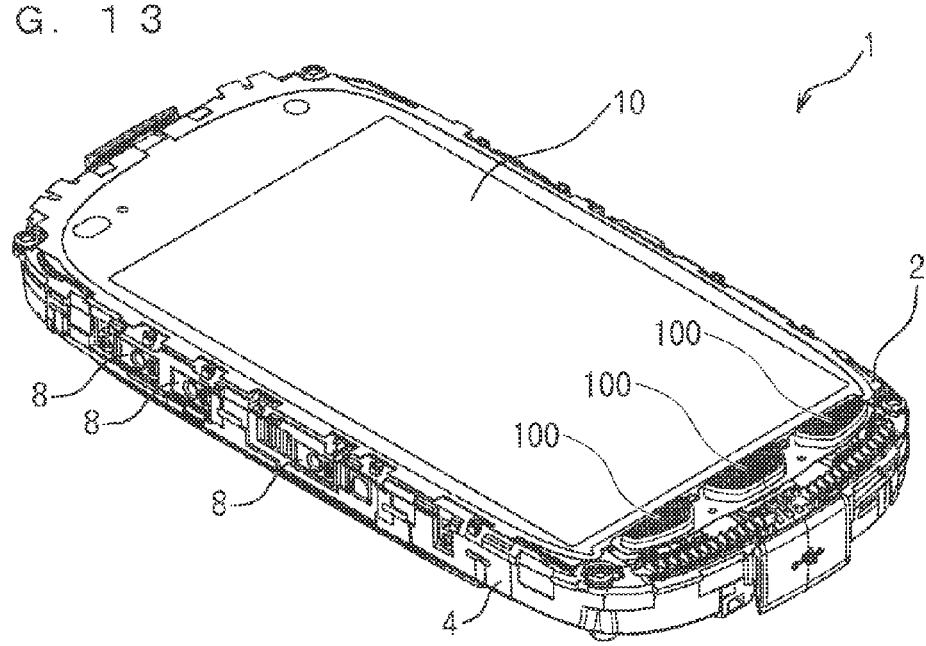
FIG. 13 is a perspective view illustrating a first step of an assembling process.
Figure 14:
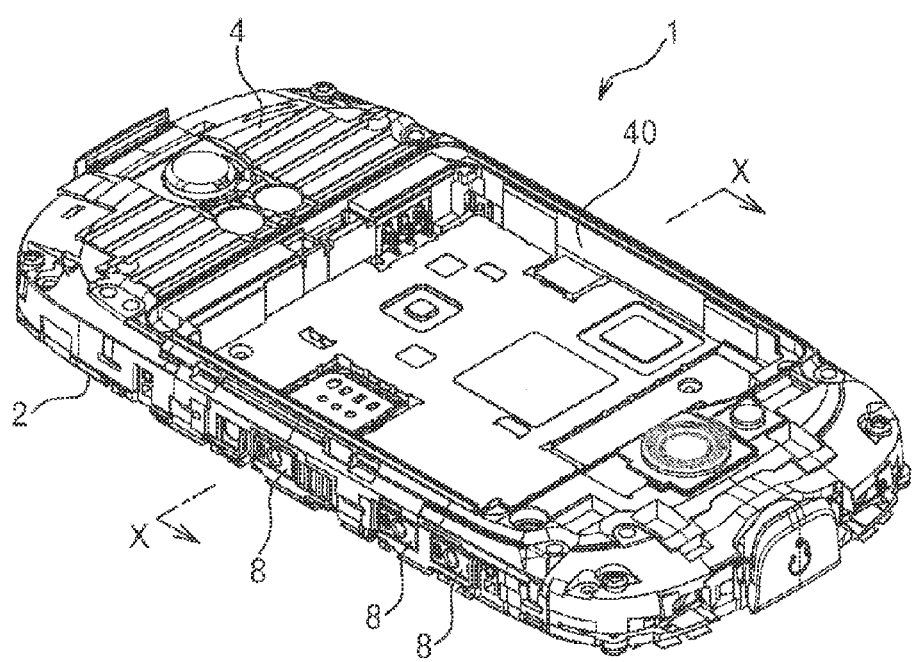
FIG. 14 is a perspective view illustrating the first step upside down.
Figure 15:
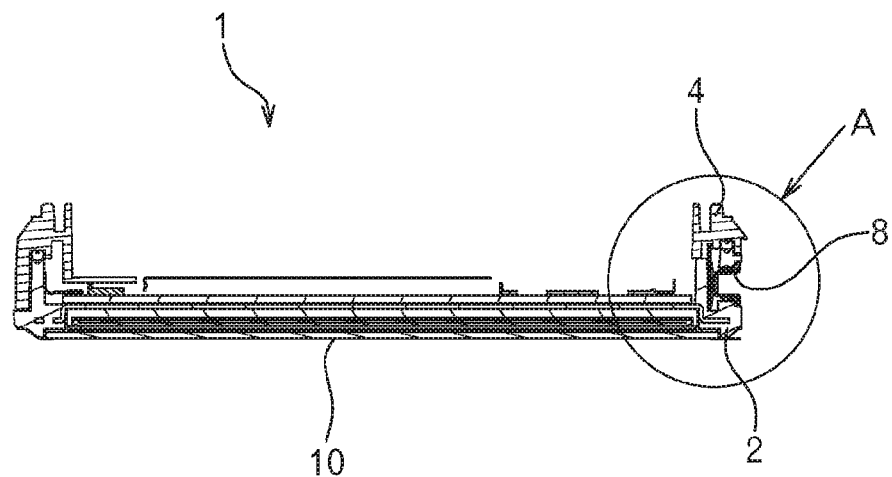
FIG. 15 is a cross-sectional view taken along line X-X of FIG. 14.

As illustrated in FIGS. 3 and 6, a plurality of switch units 9 are disposed on the side part of the front body chassis 2. As illustrated in FIGS. 11 and 12, each of the switch units 9 includes a flexible substrate 91 and one or a plurality of tact switches 92 mounted on the surface of the flexible substrate 91.

Figure 7:
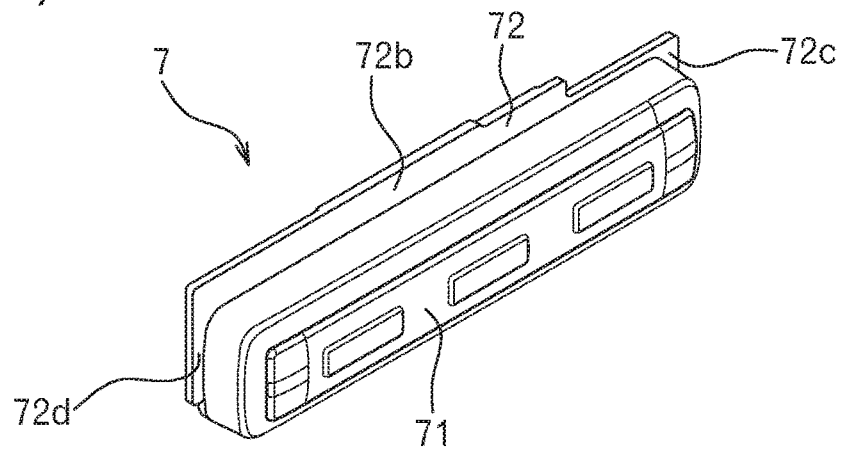
FIG. 7 is a perspective view of an operation button.
Figure 8:
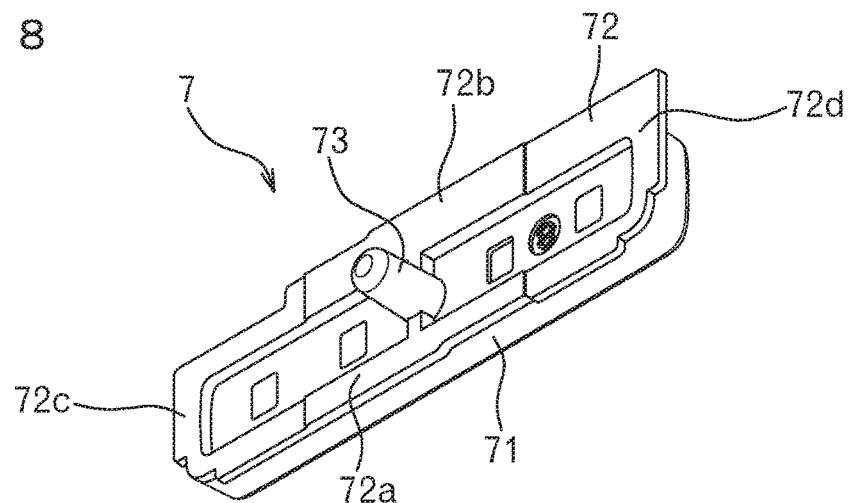
FIG. 8 is a perspective view of the operation bottom viewed from a different direction.

As illustrated in FIGS. 3 and 6, a plurality of operation buttons 7 for pressing the tact switches 92 of the switch units 9 are disposed on the side part of the front body chassis 2. As illustrated in FIGS. 7 and 8, each of the operation buttons 7 comprises a head 71 to be an operation target, a pusher 73 which projects from the back face of the head 71, and a rib 72 which extends from the outer peripheral face of the head 71 in a direction perpendicular to the projection direction of the pusher 73.

Based on a posture with the display 10 of the main body 1 facing downward as illustrated in FIG. 6, the rib 72 of the operation button 7 includes a first rib portion 72a which projects downward, a second rib portion 72b which projects upward, and a third rib portion 72c and a fourth rib portion 72d which project rightward and leftward as illustrated in FIGS. 7 and 8.

The second rib portion 72b, the third rib portion 72c, and the fourth rib portion 72d of the rib 72 are formed to have a projection amount sufficient to obtain a reliable holding power when held between the cover panels 3, 5 in the end. On the other hand, as illustrated in FIG. 33, a projection amount W1 of the first rib portion 72a is set to be smaller than a projection amount W2 of the second rib portion 72b.

As illustrated in FIG. 3, through holes 20 are formed on a side wall of the front body chassis 2. Each of the through holes 20 is used for allowing the pusher 73 of each of the operation buttons 7 to pass therethrough toward the tact switch 92 of each of the switch units 9.

Figure 9:
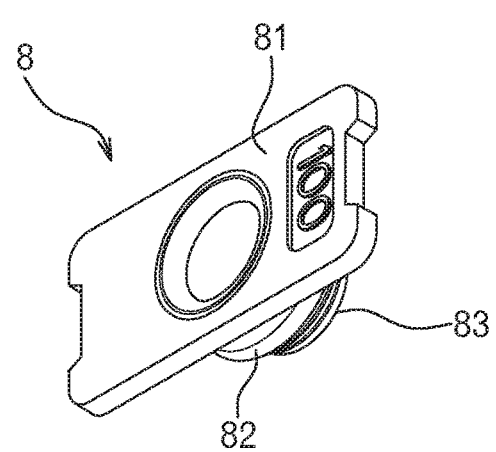
FIG. 9 is a perspective view of a waterproof packing member.
Figure 10:
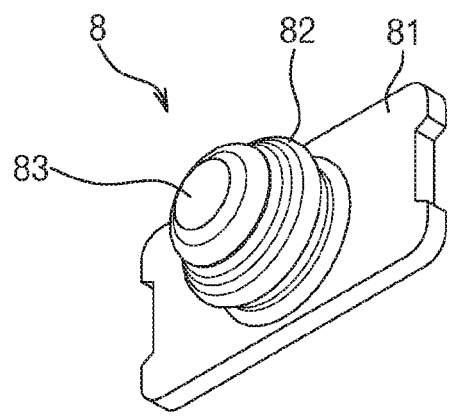
FIG. 10 is a perspective view of the waterproof packing member viewed from a different direction.

Waterproof packing members 8 for sealing the through holes 20, the waterproof packing members 8 being made of silicone rubber, are attached to the respective through holes 20. As illustrated in FIGS. 9 and 10, each of the waterproof packing members 8 is formed in a bottomed bag-like shape as a whole. Further, the waterproof packing member 8 comprises a flat plate portion 81 which has a central hole, a cylindrical peripheral wall 82 which projects from the central part of the flat plate portion 81, and a bottom wall 83 which closes a projection end of the peripheral wall 82. The pusher 73 of the operation button 7 is housed inside the peripheral wall 82.

Figure 32:
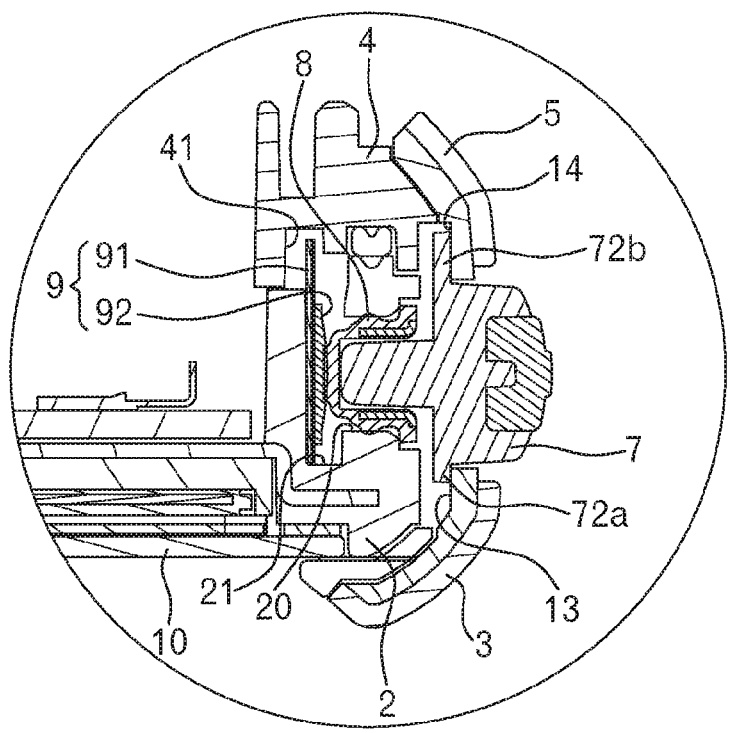
FIG. 32 is an enlarged cross-sectional view of a part E of FIG. 31.
Figure 33:
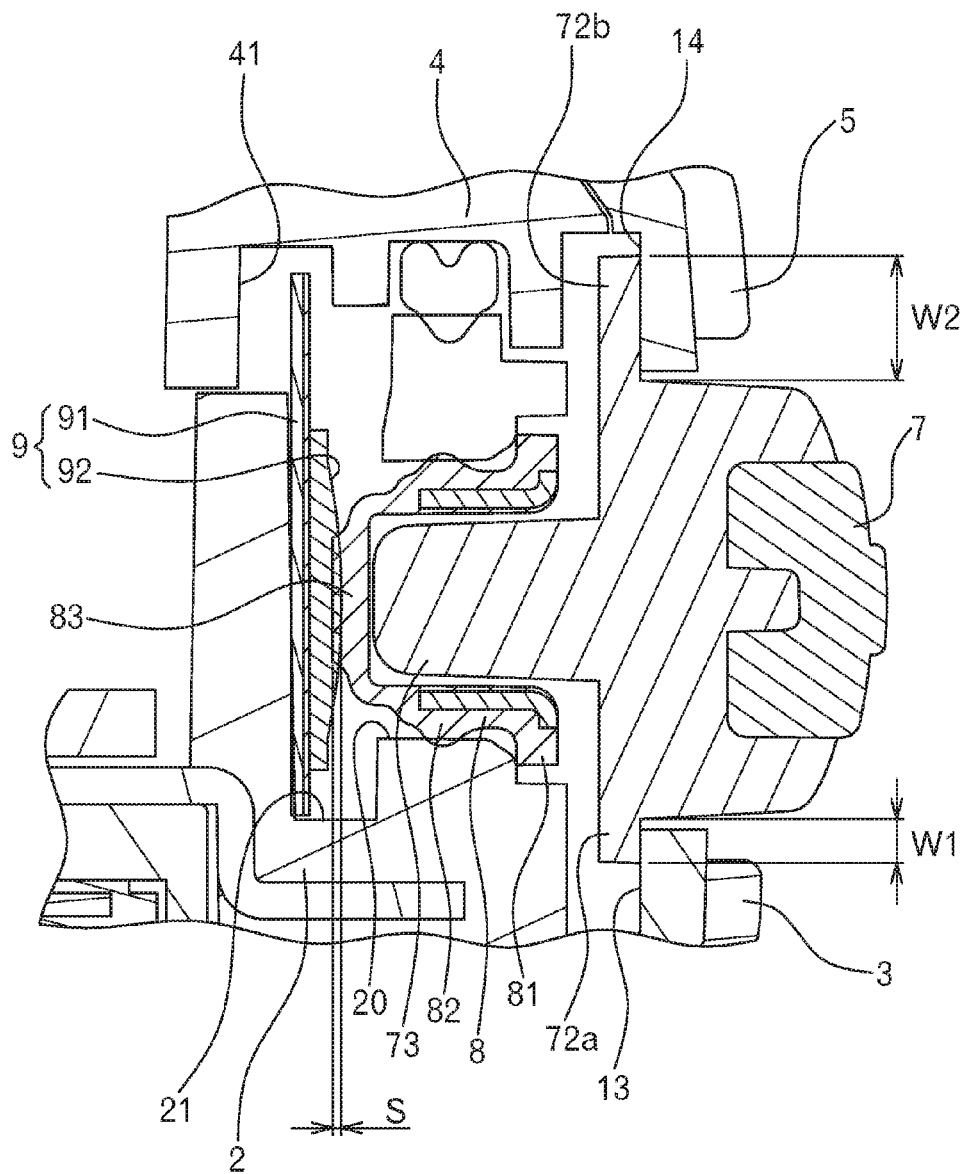
FIG. 33 is a cross-sectional view illustrating a principal part of FIG. 32 in a further enlarged manner.

In the information terminal device, as illustrated in FIGS. 32 and 33, a housing recess 21 is formed on the front body chassis 2 and a housing recess 41 is formed on the back body chassis 4 in a facing part in which the side wall of the front body chassis 2 and the side wall of the back body chassis 4 face each other. The housing recesses 21, 41 form a housing chamber for the switch unit 9.

The tip face of the bottom wall 83 of the waterproof packing member 8 is pressed against the surface of the tact switch 92 of the switch unit 9 inside the housing chamber. In this state, the switch unit 9 is fixedly held inside the housing recess 21 by an elastic repulsive force of the waterproof packing member 8.

When the bottom wall 83 of the waterproof packing member 8 is pressed against the surface of the tact switch 92 of the switch unit 9 in an assembled state in which the waterproof packing member 8 is inserted into the through hole 20 of the front body chassis 2 as illustrated in FIG. 33, a predetermined elastic deformation amount S (e.g., 0.025 mm to 0.05 mm) is generated in the waterproof packing member 8. The positional relationship between the waterproof packing member 8 and the switch unit 9 is designed in order for the tact switch 92 not to be turned on by the elastic repulsive force of the waterproof member 8.

A small clearance is set between the outer peripheral face of the pusher 73 of the operation button 7 and the inner peripheral face of the waterproof packing member 8. Further, an extremely small clearance of 0 or more is set between the tip face of the pusher 73 of the operation button 7 and the bottom wall 83 of the waterproof packing member 8.

The front cover panel 3 is attached to the front body chassis 2. The back cover panel 5 is attached to the back body chassis 4. Accordingly, in a facing part in which the front body chassis 2 and the front cover panel 3 face the back body chassis 4 and the back cover panel 5, a first groove 13 which extends across the front body chassis 2 and the front cover panel 3 and a second groove 14 which extends across the back body chassis 4 and the back cover panel 5 are formed.

The first rib portion 72a of the operation button 7 is inserted into the first groove 13 and the second rib portion 72b of the operation button 7 is inserted into the second groove 14 so that the operation button 7 is held between the cover panels 3, 5.

In this state, the second rib portion 72b of the operation button 7 is deeply inserted into the second groove 14 with a sufficient projection amount. As a result, there is almost no likelihood that the operation button 7 comes off the first groove 13 and the second groove 14.

In the information terminal device, waterproofing for the main body 1 is achieved by the O-ring 11 interposed between the front body chassis 2 and the back body chassis 4 and the waterproof packing members 8 attached to the through holes 20 of the front body chassis 2.

When the operation button 7 is depressed, the waterproof packing 8 is elastically deformed. Accordingly, the pusher 73 of the operation button 7 presses the tact switch 92 of the switch unit 9 to turn on the tact switch 92, thereby generating various operation signals.

A plurality of hardware buttons 100 and a speaker hole 110 are located on the front face of the information terminal device. The speaker hole 110 is disposed on the front cover panel 3. A plurality of button holes 101 are disposed on the front cover panel 3. The plurality of hardware buttons 100 are exposed from the respective button holes 101. A plurality of speakers 120 are disposed on the back face of the front body chassis 2. The sound from the plurality of speakers 120 is output outside of the information terminal device through the speaker hole 110.

FIGS. 13 to 32 illustrate an assembling process of the information terminal device.

As illustrated in FIGS. 13 to 16, in a first step of the assembling process, the front body chassis 2 and the back body chassis 4 are joined together to assemble the main body 1 which includes the display 10 and the electronic circuit both built therein.

Figure 16:
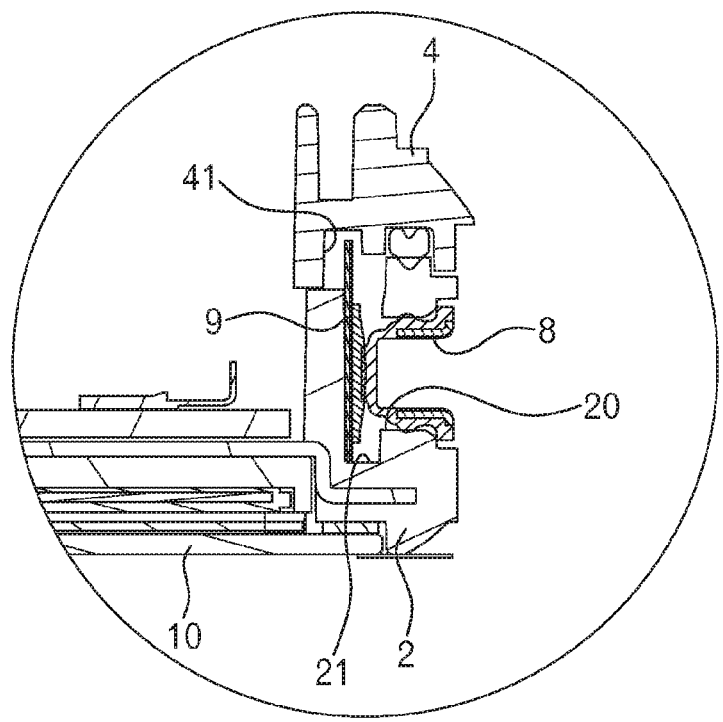
FIG. 16 is an enlarged cross-sectional view of a part A of FIG. 15.
Figure 17:
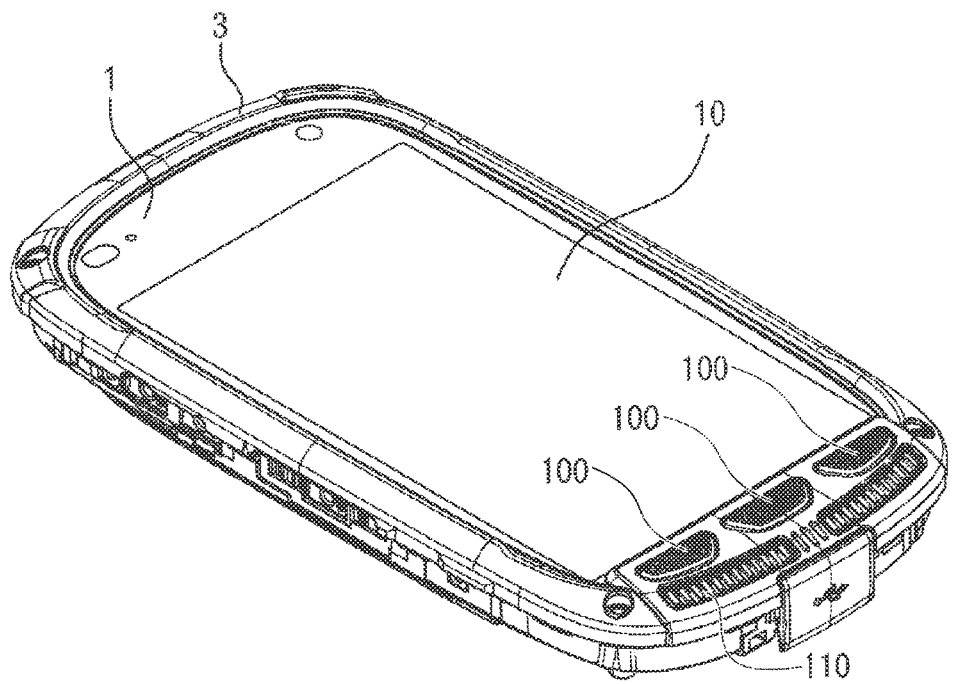
FIG. 17 is a perspective view illustrating a second step of the assembling process.
Figure 18:
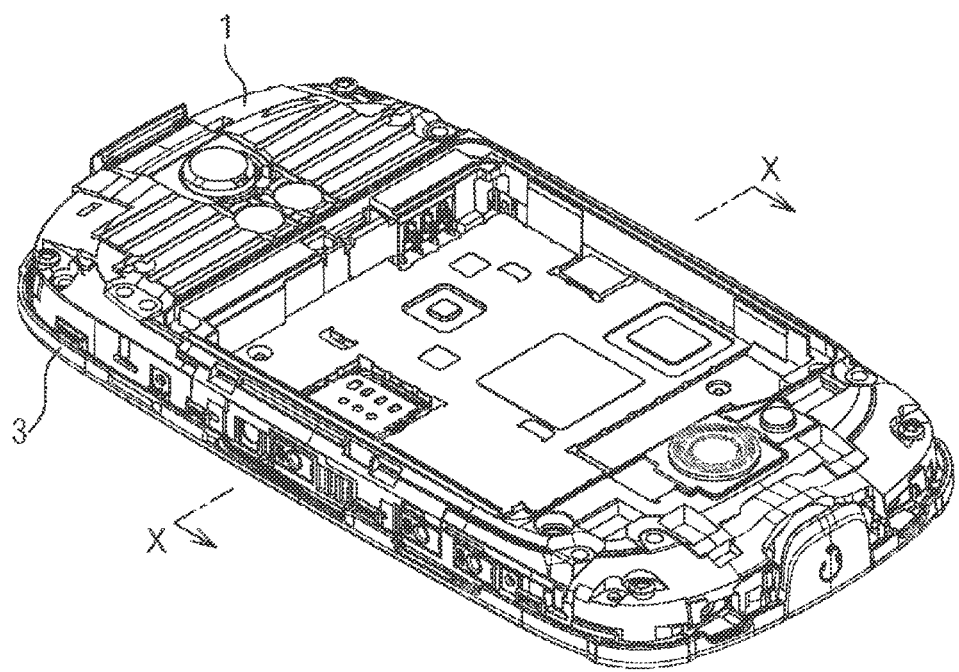
FIG. 18 is a perspective view illustrating the second step upside down.
Figure 19:
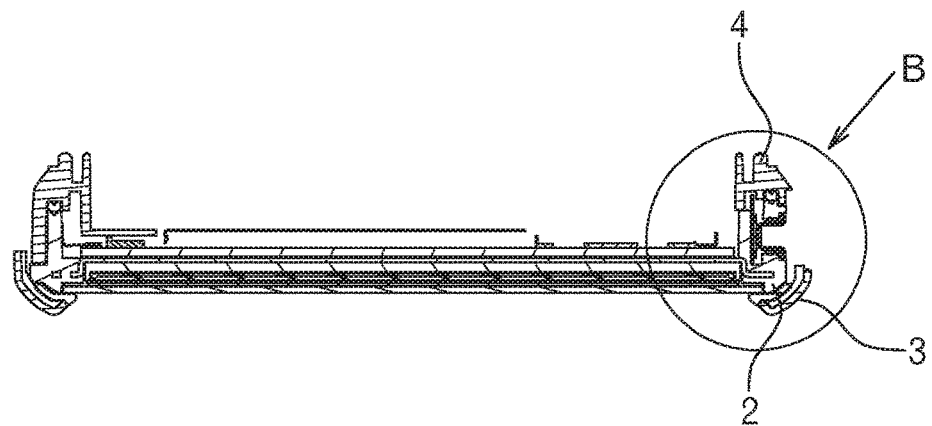
FIG. 19 is a cross-sectional view taken along line X-X of FIG. 18.

Further, as illustrated in FIG. 16, the switch unit 9 is housed in the housing chamber formed by the housing recess 21 of the front body chassis 2 and the housing recess 41 of the back body chassis 4. The waterproof packing member 8 is attached to each of the through holes 20 of the front body chassis 2.

When the switch unit 9 is housed in the housing chamber, the switch unit 9 is first inserted into the housing recess 21 with the front body chassis 2 maintained in a posture with the housing recess 21 facing upward. Accordingly, the switch unit 9 is held inside the housing recess 21 of the front body chassis 2. Thus, it is not necessary to fix the switch unit 9 with, for example, an adhesive tape.

Then, the back body chassis 4 is joined to the front body chassis 2 to assemble the main body 1 to thereby house the end of the switch unit 9 in the housing recess 41 of the back body chassis 4.

As illustrated in FIGS. 17 to 20, in a second step of the assembling process, the front cover panel 3 is attached to the front body chassis 2.

Figure 20:
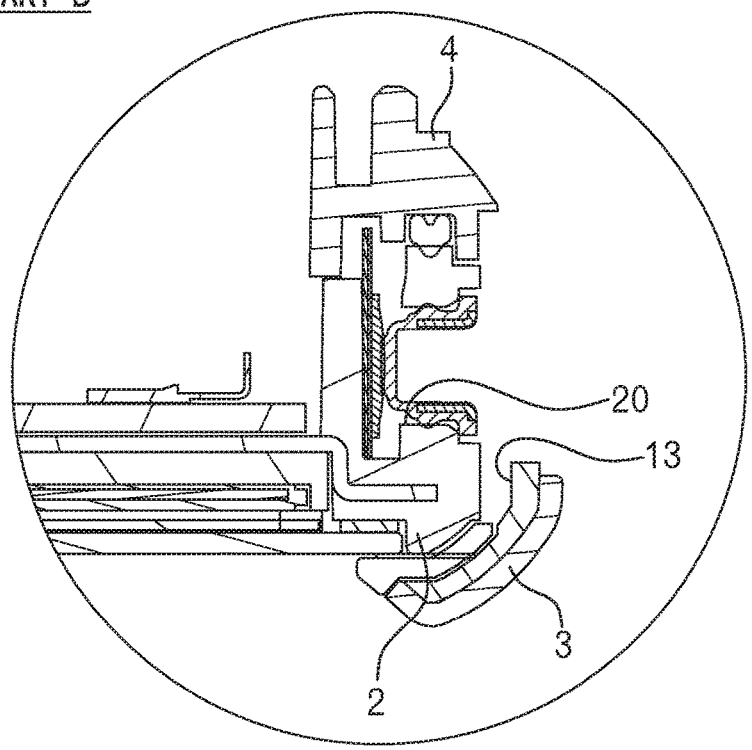
FIG. 20 is an enlarged cross-sectional view of a part B of FIG. 19.
Figure 21:
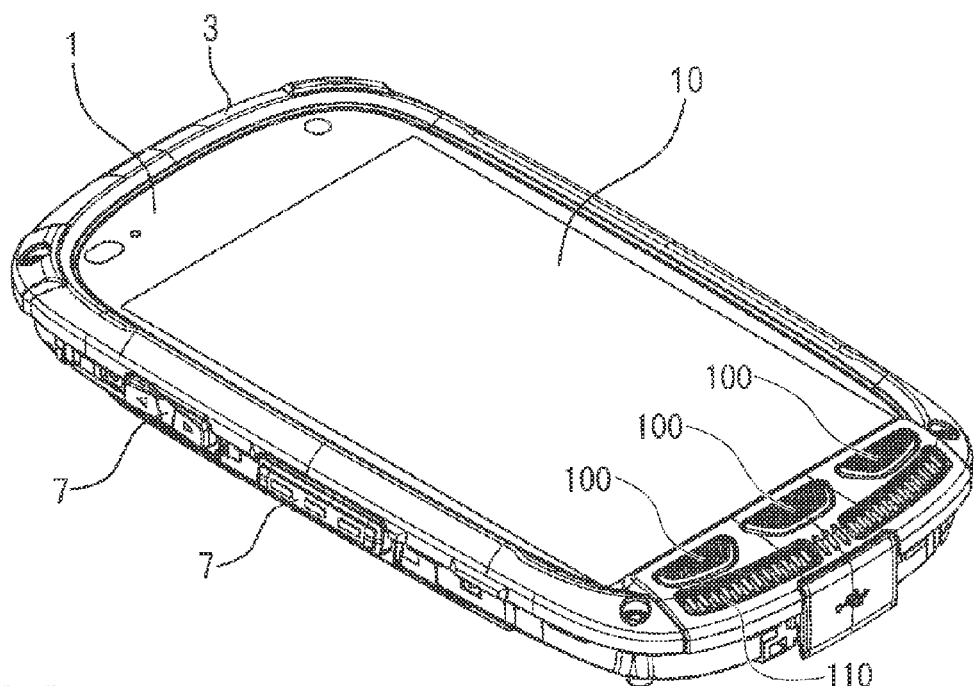
FIG. 21 is a perspective view illustrating a third step of the assembling process.
Figure 22:
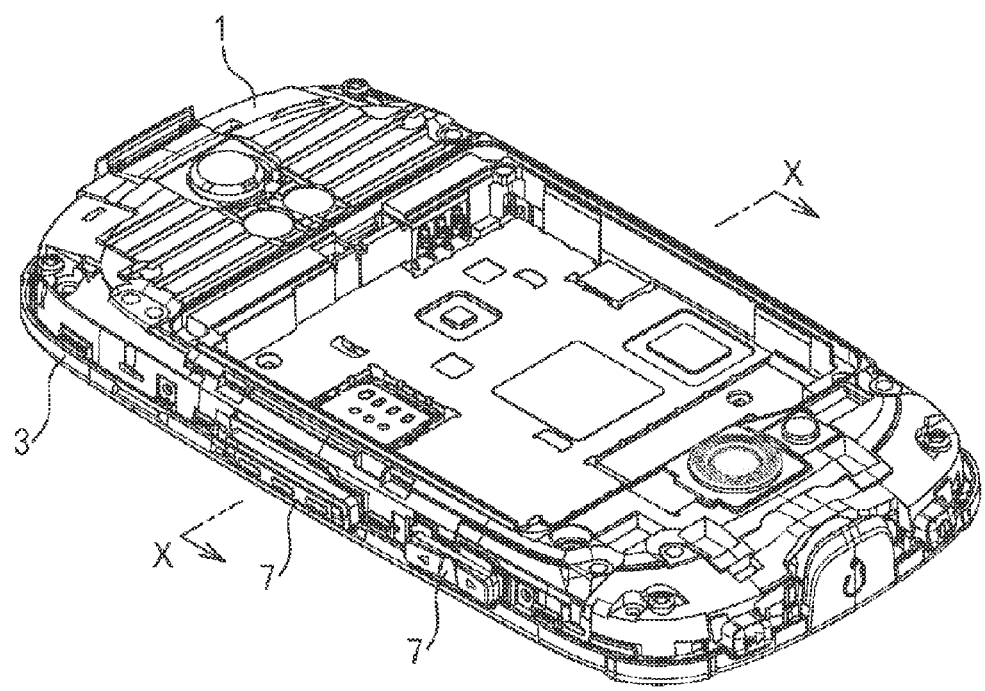
FIG. 22 is a perspective view illustrating the third step upside down.
Figure 23:
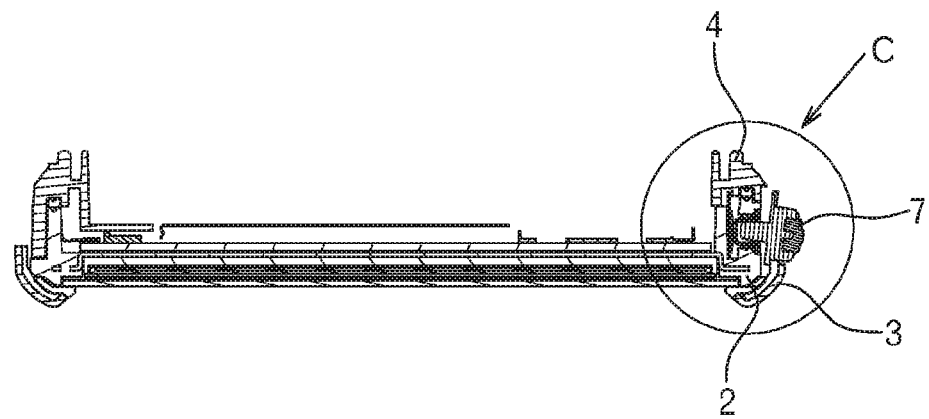
FIG. 23 is a cross-sectional view taken along line X-X of FIG. 22.

Accordingly, as illustrated in FIG. 20, the first groove 13 which is open upward is formed between the side wall of the front body chassis 2 and the side wall of the front cover panel 3.

As illustrated in FIGS. 21 to 24, in a third step of the assembling process, the plurality of operation buttons 7 are attached in a posture with the front body chassis 2 facing downward and the back body chassis 4 facing upward.

Figure 24:
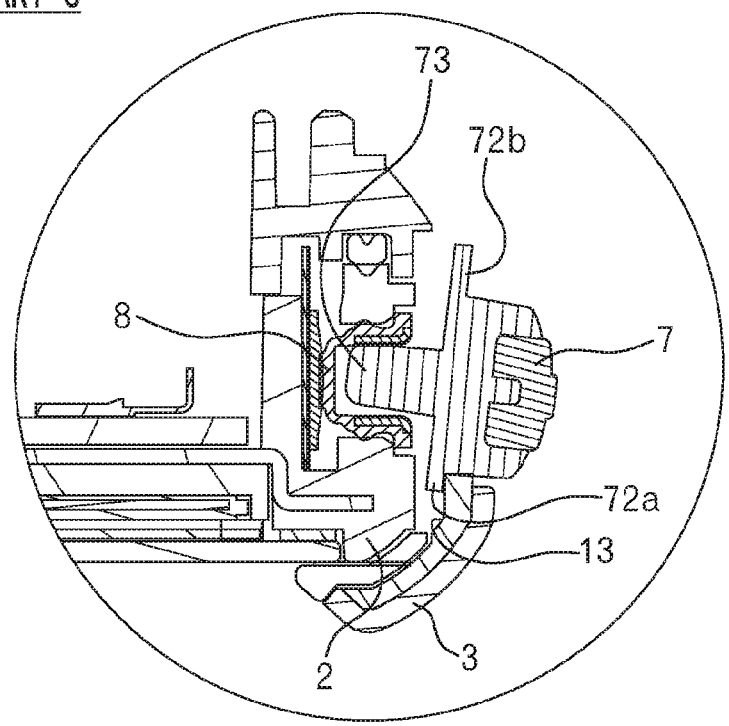
FIG. 24 is an enlarged cross-sectional view of a part C of FIG. 23.
Figure 25:
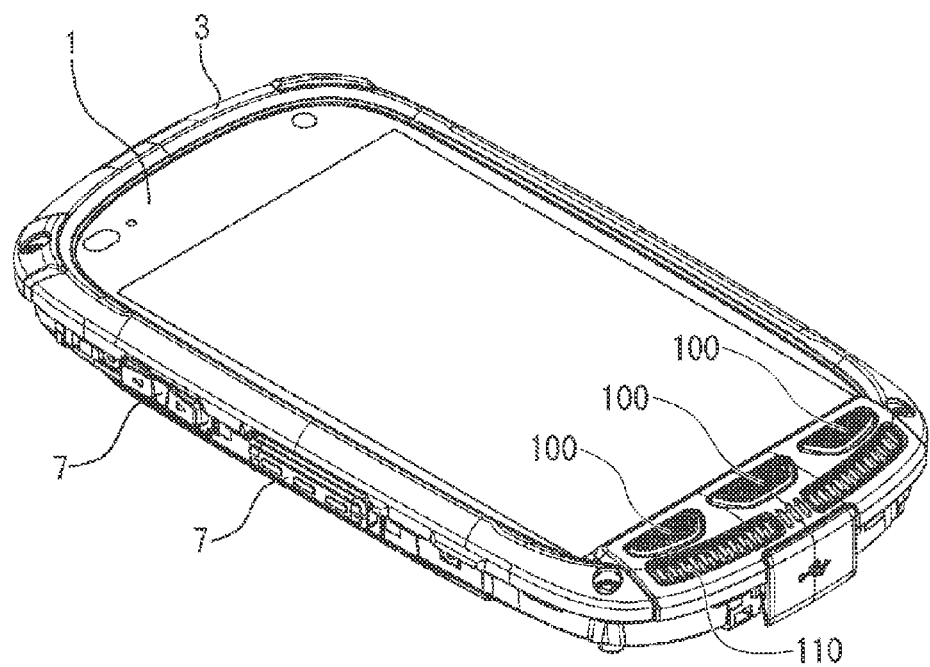
FIG. 25 is a perspective view illustrating a fourth step of the assembling process.
Figure 26:
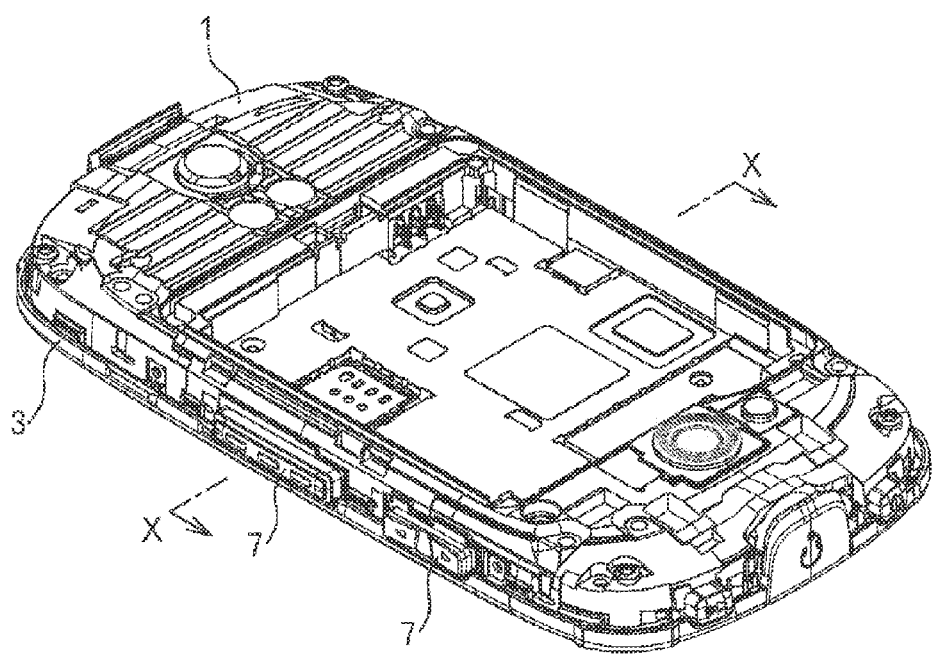
FIG. 26 is a perspective view illustrating the fourth step upside down.
Figure 27:
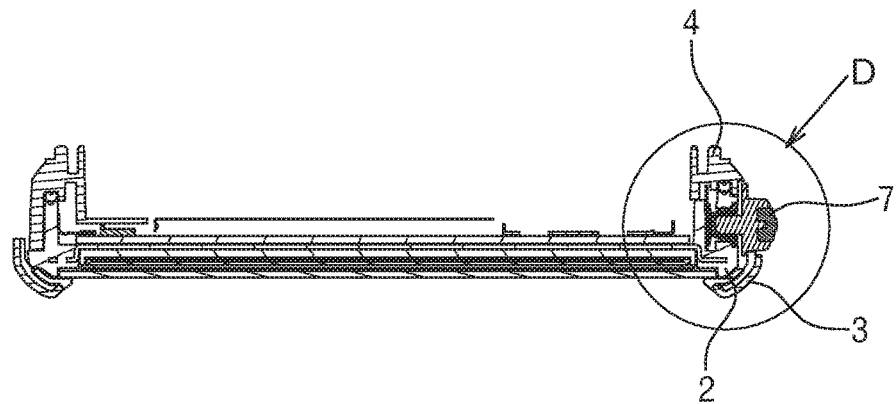
FIG. 27 is a cross-sectional view taken along line X-X of FIG. 26.
Figure 28:
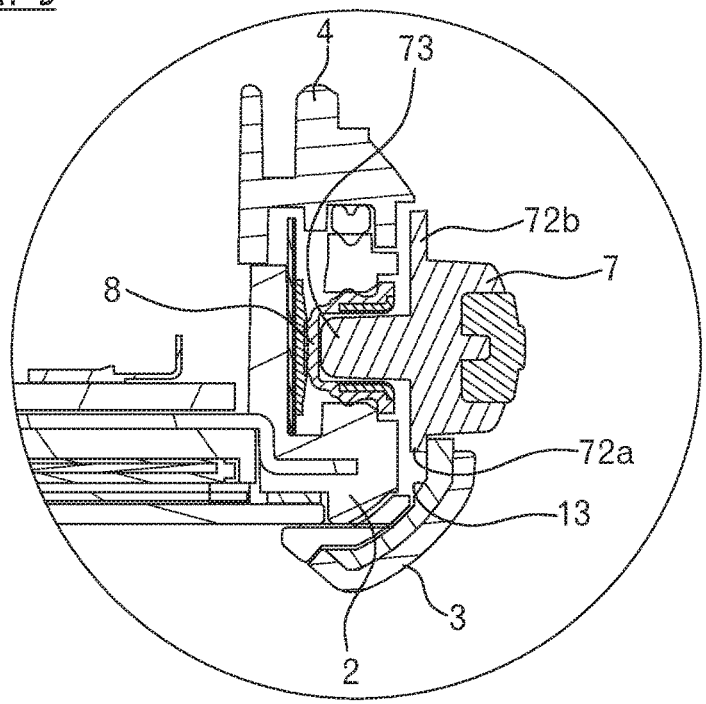
FIG. 28 is an enlarged cross-sectional view of a part D of FIG. 27.
Figure 29:
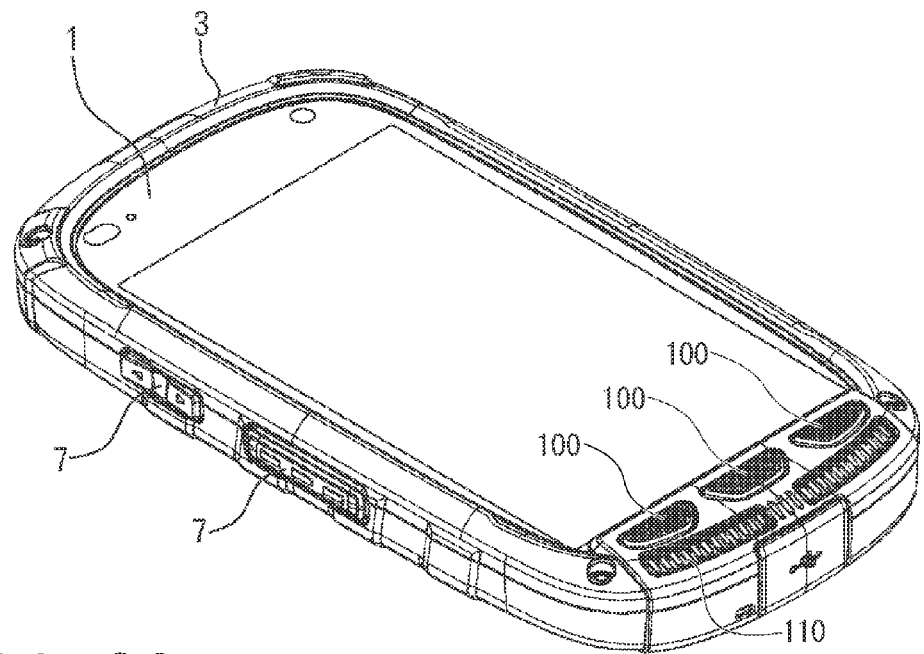
FIG. 29 is a perspective view illustrating a fifth step of the assembling process.
Figure 30:
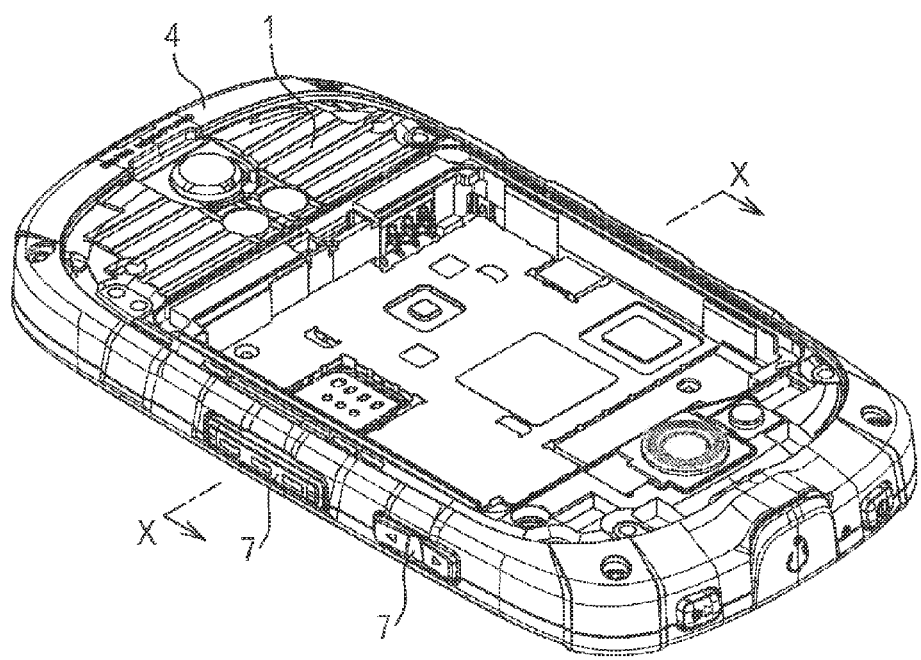
FIG. 30 is a perspective view illustrating the fifth step upside down.
Figure 31:
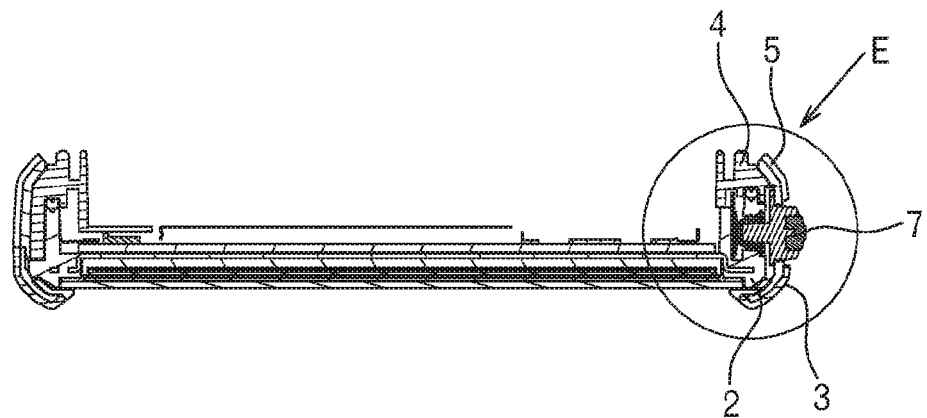
FIG. 31 is a cross-sectional view taken along line X-X of FIG. 30.

Specifically, as illustrated in FIG. 24, the pusher 73 of each of the operation buttons 7 is inserted into the corresponding waterproof packing member 8 and the first rib portion 72a is inserted into the first groove 13 with the operation button 7 slightly inclined. In a configuration in which the first rib portion 72a has the same projection amount as the second rib portion 72b, it is difficult to attach the operation buttons 7 in this manner.

As illustrated in FIGS. 25 to 28, in a fourth step of the assembling process, a regular posture with the pusher 73 of each of the operation buttons 7 horizontally extending inside the corresponding waterproof packing member 8 is set.

In this state, each of the operation buttons 7 is held by the front body chassis 2 and the front cover panel 3. Thus, the operation button 7 will not drop off even if the hand is released from the operation button 7.

As illustrated in FIGS. 29 to 32, in a fifth step of the assembling step, the back cover panel 5 is attached to the back body chassis 4 in a posture with the front body chassis 2 facing downward and the back body chassis 4 facing upward.

Accordingly, as illustrated in FIG. 32, the second rib portion 72b of each of the operation buttons 7 is housed inside the second groove 14 so that the operation button 7 is held between the front cover panel 3 and the back cover panel 5.

In the assembling process of the information terminal device, each of the operation buttons 7 can be inserted into and attached to the first groove 13 with only the front cover panel 3 attached to the main body 1 in the third step of the assembling process illustrated in FIGS. 21 to 24 and the fourth step of the assembling process illustrated in FIGS. 25 to 28. Therefore, an operation of mounting the operation buttons 7 is extremely easy.

On the other hand, a conventional method employs an operation in which all the water proof packing members 8 are held by, for example, the hand or a jig with the pushers 73 of the operation buttons 7 inserted into the respective waterproof packing members 8 of the main body 1, and, in this state, the front cover panel 3 and the back cover panel 5 are attached to the main body 1. Therefore, an operation of mounting the operation buttons 7 is difficult.

The information terminal device according to the present invention makes it possible to reduce the number of components and the number of assembling steps and also facilitate the assembling process with a simple structure of merely slightly changing the positional relationship between the switch unit 9 and the waterproof packing 8 and slightly changing the projection amount of the rib 72 of the operation button 7.

The configurations of the respective members of the present invention are not limited to the above embodiment. A person skilled in the art may make various modifications without departing from the spirit of the invention described in the claims.

DESCRIPTION OF REFERENCE CHARACTERS 1 main body
13 first groove
14 second groove
2 front body chassis
3 front cover panel
4 back body chassis
5 back cover panel
21 housing recess
41 housing recess
6 cover body
10 display 7 operation button
72a first rib portion
72b second rib portion
73 pusher
8 waterproof packing member
9 switch unit
91 flexible substrate
92 tact switch

The invention claimed is:

1. An electronic apparatus that is longer in one direction, the electronic apparatus comprising:
    a display located on a front face of the electronic apparatus;
    a body chassis housing the display, the body chassis including a first through hole located on a side face of the body chassis;
    a first switch located in the body chassis, and facing the first through hole;
    a first operation button for pressing the first switch, the first operation button being exposed from a side face of the electronic apparatus;
    a first waterproof member including a part interposed between the first switch and the first operation button, such that no part of the first operation button directly contacts the first switch, the first waterproof member sealing an opening of the first through hole;
    a plurality of hardware buttons located at a lower end portion of the front face of the electronic apparatus, the plurality of hardware buttons being aligned along a short-side direction of the electronic apparatus; and
    a back cover covering a back face of the body chassis,
    wherein the front face of the electronic apparatus includes a speaker hole located below the plurality of hardware buttons,
    wherein the back cover is a single member, and the back cover includes a part continuously extending along a whole circumference of the back face of the body chassis,
    wherein the first operation button includes a rib engaging with the back cover, the rib being formed on a peripheral part of the first operation button.

2. The electronic apparatus according to claim 1, wherein the first through hole is located on an upper side face of the body chassis, and the first operation button is exposed from an upper side face of the electronic apparatus.

3. The electronic apparatus according to claim 2, wherein the body chassis includes a second through hole located on the upper side face of the body chassis, the electronic apparatus further comprising:
    a second switch located in the body chassis, and facing the second through hole;
    a second operation button for pressing the second switch, the second operation button being exposed from the upper side face of the electronic apparatus; and
    a second waterproof member including a part interposed between the second switch and the second operation button, the second waterproof member sealing an opening of the second through hole.

4. The electronic apparatus according to claim 1, wherein the body chassis includes a front body chassis and a back body chassis.

5. The electronic apparatus according to claim 4, wherein a speaker is located on a back face of the front body chassis, and sound from the speaker is output outside of the electronic apparatus through the speaker hole.

6. The electronic apparatus according to claim 1, further comprising a front cover covering a front face of the body chassis.

7. The electronic apparatus according to claim 6, wherein the front cover includes a part continuously extending along an upper end of the front face of the body chassis.

* * * * *